(12) United States Patent
Abramov

(10) Patent No.: US 10,148,466 B2
(45) Date of Patent: Dec. 4, 2018

(54) BROAD BAND AND NARROW BAND FREQUENCY RESPONSE EQUALIZATION

(71) Applicant: Corning Optical Communications Wireless Ltd, Airport City (IL)

(72) Inventor: Yury Abramov, Rosh Ha'ayin (IL)

(73) Assignee: Corning Optical Communications Wireless Ltd., Airport City (IL)

( * ) Notice: Subject to any disclaimer, the term of this patent is extended or adjusted under 35 U.S.C. 154(b) by 0 days.

(21) Appl. No.: 15/475,573

(22) Filed: Mar. 31, 2017

(65) Prior Publication Data

US 2017/0272282 A1  Sep. 21, 2017

Related U.S. Application Data

(63) Continuation of application No. PCT/IL2015/051189, filed on Dec. 8, 2015.

(Continued)

(51) Int. Cl.
*H04L 25/03* (2006.01)
*H04B 17/00* (2015.01)
(Continued)

(52) U.S. Cl.
CPC ..... *H04L 25/03019* (2013.01); *H03G 3/3042* (2013.01); *H04B 7/04* (2013.01);
(Continued)

(58) Field of Classification Search
CPC .... H04H 20/28; H04H 60/21; H04L 27/2601; H04L 12/2801; H04L 5/0048; H04L 25/03019; H04L 25/03; H04L 5/0035; H04L 27/01; H04L 5/0091; H04L 5/0092; H04L 25/03878; H04W 84/12; H04J 3/14; H04B 7/024; H04B 7/04; H04B 17/0085; H04B 17/00; H04B 10/25753; H04B 17/21; H03G 5/16; H03G 3/3042; H03G 3/3052

See application file for complete search history.

(56) References Cited

U.S. PATENT DOCUMENTS

| 8,428,510 B2 * | 4/2013 | Stratford ............... H04W 52/52 455/7 |
| 8,437,383 B2 | 5/2013 | Wiwel et al. |
| 2013/0071112 A1 | 3/2013 | Melester et al. |

FOREIGN PATENT DOCUMENTS

| WO | 2010087919 A3 | 8/2010 |
| WO | 2011119384 A2 | 9/2011 |
| WO | 2014040608 A1 | 3/2014 |

OTHER PUBLICATIONS

Patent Cooperation Treaty, International Search Report for PCT/IL2015/051189, dated Mar. 4, 2016, 3 pages.

* cited by examiner

*Primary Examiner* — Rahel Guarino
(74) *Attorney, Agent, or Firm* — C. Keith Montgomery

(57) ABSTRACT

A distributed antenna system (DAS) and method are disclosed. The system includes at least one RIM associated with a remote unit. The RIMs and the remote units (RU) are configured for transmitting and receiving test signal over at least one narrow band of frequencies. The system includes a plurality of signal generators associated with a signal path, each signal generator configured for generating a test signal over the at least one narrow band of frequencies; a controller configured to generate a test signal for the signal path; and, an equalizer for adjusting gain for the signal path according to at least one of the narrow band of frequencies.

18 Claims, 11 Drawing Sheets

Related U.S. Application Data

(60) Provisional application No. 62/090,671, filed on Dec. 11, 2014.

(51) Int. Cl.
 *H04B 7/04* (2017.01)
 *H03G 3/30* (2006.01)
 *H03G 5/16* (2006.01)

(52) U.S. Cl.
 CPC ... *H04B 17/0085* (2013.01); *H04L 25/03878* (2013.01); *H03G 3/3052* (2013.01); *H03G 5/16* (2013.01)

"PRIOR ART"

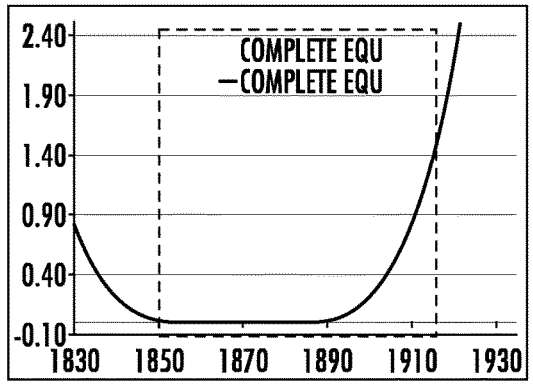
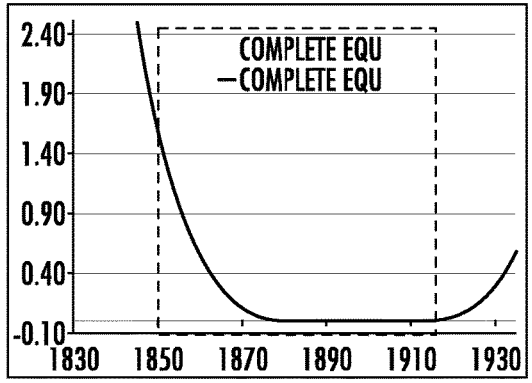
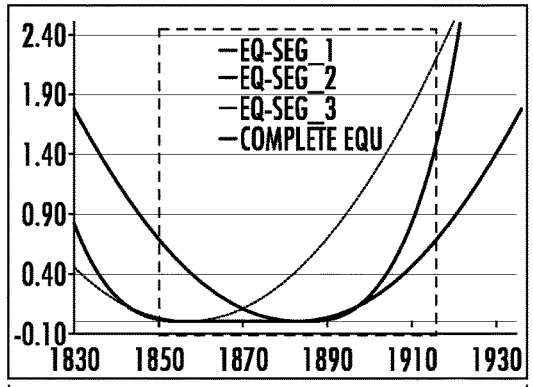
*FIG. 9D*
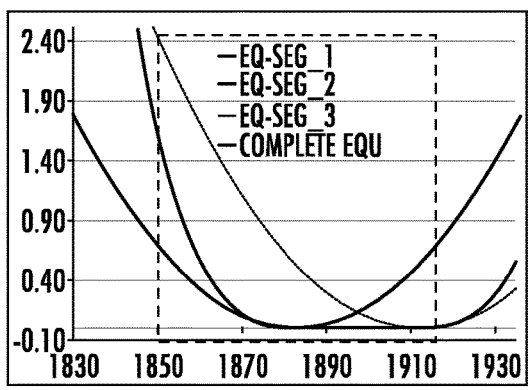
*FIG. 9E*
*FIG. 9F*
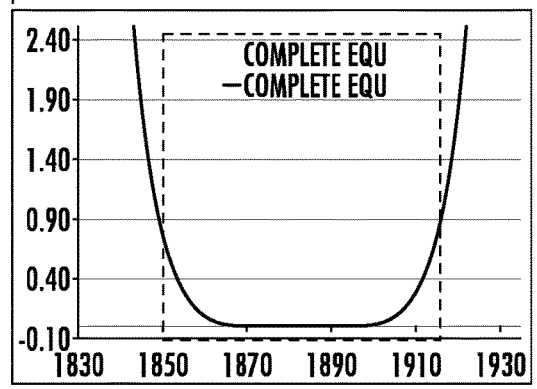
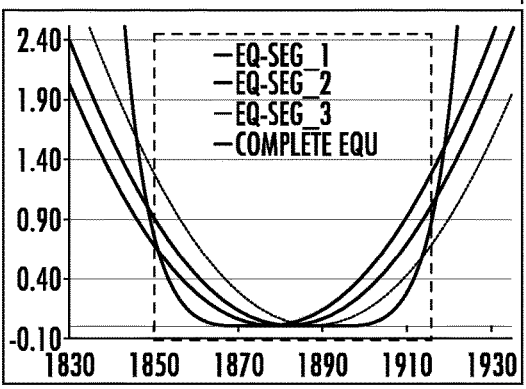

| BAND NAME | PATH | FREQ. RANGE (MHz) | REGION A | | REGION B | | REGION B | |
|---|---|---|---|---|---|---|---|---|
| | | | EQ-1-$F_c$ (MHz) | $V_t$[V] | EQ-2-$F_c$ (MHz) | $V_t$ | EQ-3-$F_c$ (MHz) | $V_t$ |
| PCS | UL | 1850-1915 | NI | 12 | NI | 12 | NI | 12 |
| PCS | UL | 1850-1915 | 1820 | 7 | 1820 | 7 | 1820 | 7 |
| PCS | UL | 1850-1915 | 1840 | 6 | 1840 | 6 | 1840 | 6 |
| PCS | UL | 1850-1915 | 1860 | 5 | 1860 | 5 | 1860 | 5 |
| PCS | UL | 1850-1915 | 1880 | 4 | 1880 | 4 | 1880 | 4 |
| PCS | UL | 1850-1915 | 1900 | 3 | 1900 | 3 | 1900 | 3 |
| PCS | UL | 1850-1915 | 1920 | 2 | 1920 | 2 | 1920 | 2 |
| PCS | UL | 1850-1915 | 1940 | 1 | 1940 | 1 | 1940 | 1 |
| PCS | DL | 1930-1995 | NI | 12 | NI | 12 | NI | 12 |
| PCS | DL | 1930-1995 | 1820 | 7 | 1820 | 7 | 1820 | 7 |
| PCS | DL | 1930-1995 | 1840 | 6 | 1840 | 6 | 1840 | 6 |
| PCS | DL | 1930-1995 | 1860 | 5 | 1860 | 5 | 1860 | 5 |
| PCS | DL | 1930-1995 | 1880 | 4 | 1880 | 4 | 1880 | 4 |
| PCS | DL | 1930-1995 | 1900 | 3 | 1900 | 3 | 1900 | 3 |
| PCS | DL | 1930-1995 | 1920 | 2 | 1920 | 2 | 1920 | 2 |
| PCS | DL | 1930-1995 | 1940 | 1 | 1940 | 1 | 1940 | 1 |
| CELL | UL | 824-849 | NI | 12 | NI | 12 | NA | NA |
| CELL | UL | 824-849 | 820 | 7 | 820 | 7 | NA | NA |
| CELL | UL | 824-849 | 825 | 6 | 825 | 6 | NA | NA |
| CELL | UL | 824-849 | 830 | 5 | 830 | 5 | NA | NA |
| CELL | UL | 824-849 | 835 | 4 | 835 | 4 | NA | NA |
| CELL | UL | 824-849 | 840 | 3 | 840 | 3 | NA | NA |
| CELL | UL | 824-849 | 845 | 2 | 845 | 2 | NA | NA |
| CELL | UL | 824-849 | 855 | 1 | 855 | 1 | NA | NA |
| CELL | DL | 869-894 | NI | 12 | NI | 12 | NA | NA |
| CELL | DL | 869-894 | 865 | 7 | 865 | 7 | NA | NA |
| CELL | DL | 869-894 | 870 | 6 | 870 | 6 | NA | NA |
| CELL | DL | 869-894 | 875 | 5 | 875 | 5 | NA | NA |
| CELL | DL | 869-894 | 880 | 4 | 880 | 4 | NA | NA |
| CELL | DL | 869-894 | 885 | 3 | 885 | 3 | NA | NA |
| CELL | DL | 869-894 | 890 | 2 | 890 | 2 | NA | NA |
| CELL | DL | 869-894 | 895 | 1 | 895 | 1 | NA | NA |

NI = NO INFLUENCE  UL = UPLINK
NA = NOT AVAILABLE  DL = DOWNLINK

FIG. 11

BROAD BAND AND NARROW BAND FREQUENCY RESPONSE EQUALIZATION

RELATED APPLICATIONS

This application is a continuation of International Application No. PCT/IL15/051189 filed on Dec. 8, 2015 and claims the benefit of priority under 35 U.S.C. § 119 of U.S. Provisional Application No. 62/090,671 filed on Dec. 11, 2014, the content of which are relied upon and incorporated herein by reference in their entireties.

BACKGROUND

The disclosure relates generally to reliability of distributed antenna systems, and more particularly to techniques for enhancing spectral efficiency which may be used in a distributed antenna system.

Wireless communications services are expanding rapidly into an ever-wider array of communications media. Cellular communication and WiFi (or wireless fidelity systems), for example, are now commonplace and being used in a variety of commercial and public settings, such as homes, offices, shops, malls, libraries, airports, and the like. Distributed antenna systems (DAS) are commonly used to improve coverage and communication of cellular communication and WiFi communication systems. Distributed antenna systems (DAS) typically include a plurality of spatially separated antennas. The distributed antennas systems (DAS) communicate with a variety of such commercial communications systems to distribute their services to clients within range of the distributed antenna system.

Generally, distributed antenna systems (DASs) operate in a wide range of frequencies. For example, common designs for a single DAS require the system to provide services in a 700 MHz band, in a 2.7 GHz band and in bands between. In order to support future services, a DAS may even need to support services in frequency bands ranging from 100 Mhz to 3500 MHz and even above. Maintaining efficient operation over such a wide range of frequencies is not without challenges.

Consider that the frequency response of electronic components and circuits in such a wide range of frequencies is not constant. Therefore, system gain will vary over the frequency range and within each of the service bands for the DAS. Having a substantially constant gain over the operational frequency range of the DAS and within each of the service bands is desirable, otherwise, performance might differ (usually worsen) along the frequency range. For example, consider that in order to stay within the maximum transmission power level dictated by regulations, the maximum output power will have to be set at frequencies where the gain is maximal. For frequencies where the gain is lower, a lower power signal is transmitted and thus results in reduced Quality of Service (QoS) or Quality of Experience (QoE) performance to users.

Typically, the manufacturing process will attempt to account for some of these issues. For example, in order to avoid large variations in the frequency response, the DAS elements may be adjusted in the factory. Often, such adjustments call for setting a pre-determined average gain and as flat as possible frequency response within the service band. However, this may not be adequate for many installations.

For example, when installing a DAS that includes multiple cascading DAS elements, the overall errors in gain of each DAS element, combined with the variations in the frequency response due to imperfect matching issues, may accumulate and result in significant gain differences between different working points along the frequency range of the DAS and within each of the service bands. Particularly for complex DAS installations, it is required to manually adjust the power of most or all elements in a new installation of a DAS for compensating for the inadequate frequency response. Manual adjustment must be performed "in the field" and prior to system operation. Due to the large number of signal paths (from each base station to each remote unit), manual adjustment is a tedious, costly and inefficient process.

What is needed is a better way to improve gain over the operational frequency range of the DAS and within each of the service bands to better provide for optimizing DAS performances in terms of gain and power.

No admission is made that any reference cited herein constitutes prior art. Applicant expressly reserves the right to challenge the accuracy and pertinency of any cited documents.

SUMMARY

One embodiment of the disclosure relates to a distributed antenna system (DAS). The distributed antenna system (DAS) includes at least one base station interface (usually called RIM—Radio Interface Module) associated with a remote unit (RU). The RIM and the remote unit (RU) are configured for transmitting and receiving in one or more frequency bands that may be spread over a wide frequency range (e.g 450 MHz-3000 MHZ). The distributed antenna system (DAS) further includes a signal generator associated with a signal path between the RIM and the remote unit (RU), the signal generators (which reside in each RIM for adjusting DL path and each RU for adjusting UL path) are configured for generating test signals that may vary over the frequency bands which are supported by the RIMs; a master controller configured to generate the test signal for the signal path; and, an equalizer for adjusting the frequency response for the signal path At least one DCA (digitally controlled attenuator) is used for final gain adjustment.

An additional embodiment of the disclosure relates to a method for adjusting a distributed antenna system (DAS). The method includes broadcasting test signals over a broad band of channels as well as over at least one narrow band channel over a signal path; detecting power for the test signal at a remote unit; and, adjusting frequency response and gain.

An additional embodiment of the disclosure relates to a computer program product stored on non-transitory machine readable. The product includes machine executable instructions for adjusting output of a distributed antenna system (DAS), by implementing instructions for: broadcasting test signals over a broad band of channels as well as over at least one narrow band channel over a signal path; detecting power for the test signal at a remote unit (RU); and, adjusting frequency response & gain for the broad band of channels as well as the at least one narrow band channel to increase response over the signal path.

An additional embodiment of the disclosure relates to a distributed antenna system (DAS). Distributed antenna system (DAS) fed by a plurality of base stations, each base station configured to transmit and receive over at least one narrow band channel; a head end unit (HEU) configured for transmitting signals for at least one band; a radio interface module (RIM) associated with each base station, the radio interface module (RIM) configured for disconnecting a narrow band signal from the associated base station and connecting a test signal; a remote unit (RU) configured for receiving and transmitting signals from the head end unit (HEU); the remote unit (RU) including a broad band equalizer module (which illustratively is a circuit and not necessarily a plug in module), a plurality of narrow band equalizer modules and an RU controller, the RU controller configured for adjusting the broad band equalizer module and the narrow band equalizer modules; and a master controller configured for controlling the radio interface module (RIM) and the equalizer controller.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIGS. 9A, 9B, 9C, 9D, 9E, and 9F, collectively referred to herein as FIG. 9, are response curves depicting frequency response for a single stage of the narrow band equalizer. By adjusting the equalizer stage the whole shape moves in the frequency domain;

FIG. 11 is a table depicting various equalization settings that may be stored in the controller.

DETAILED DESCRIPTION

Figure 1:
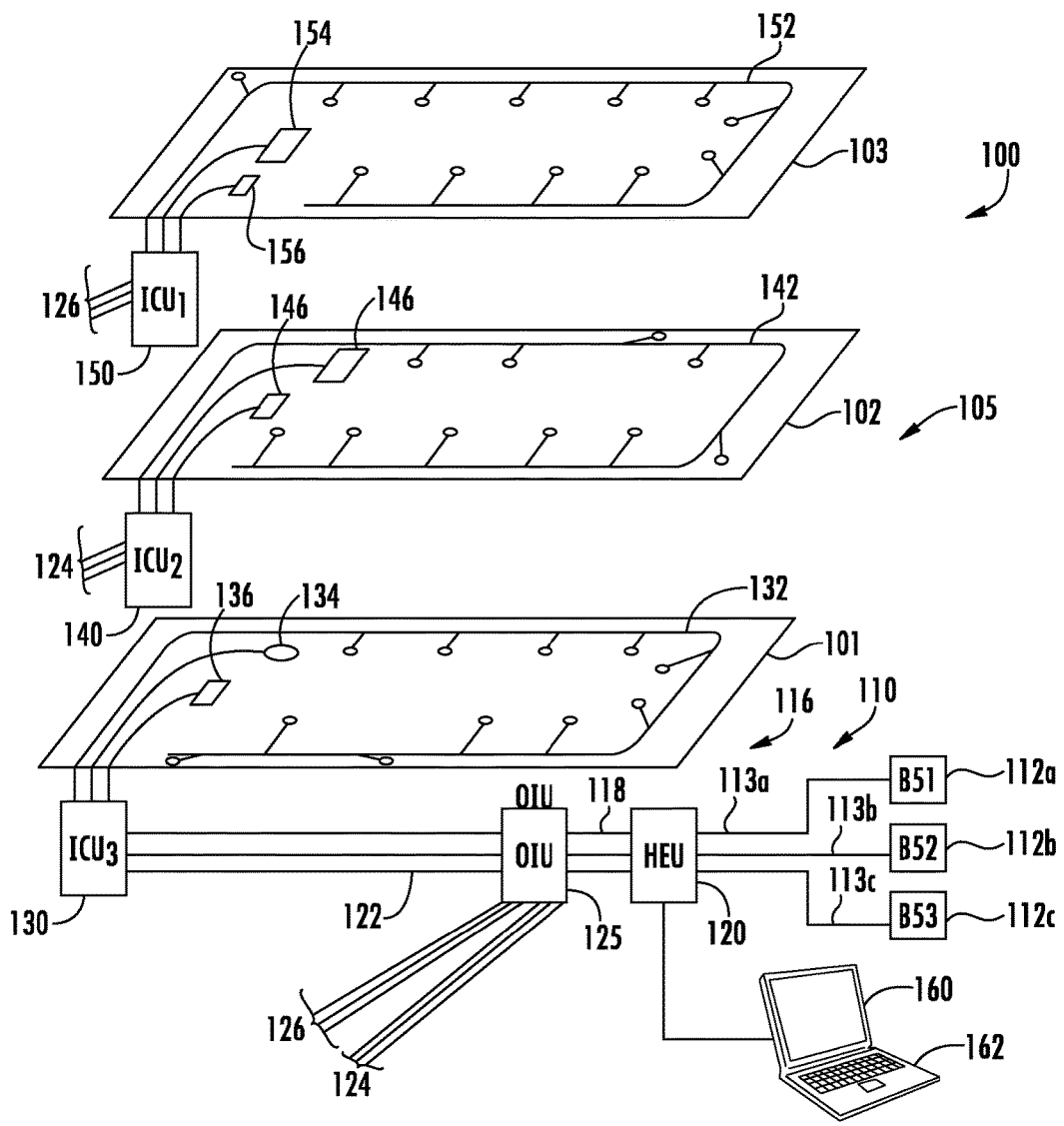
FIG. 1 depicts a schematic diagram of an exemplary general description of distributed antenna system configured to distribute communications signals within an installation, such as a building. The communications signals illustratively includes digital data.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the various accompanying figures, can be arranged, substituted, combined, separated, and designed in a wide variety of different configurations, all of which are explicitly contemplated herein.

The technology of this disclosure relates generally to wireless communications within a distributed antenna system (DAS). More specifically, the teachings herein relate to techniques for monitoring and managing power of wireless signals operating over bands of frequencies within a distributed antenna system (DAS).

Briefly stated, a distributed antenna system (DAS) and method are disclosed. The system includes at least one base station associated with a remote unit. The base station and the remote unit are configured for transmitting and receiving a broad band of channels as well as at least one narrow band channel. The system includes a plurality of signal generators associated with a signal path, each signal generator configured for generating a broad band test signal over the broad band of channels as well as a narrow band test signal over the at least one narrow band channel; a controller configured to generate the broad band test signal as well as the narrow band test signal for the signal path; and, an equalizer for adjusting gain for the signal path according to at least one of the broad band test signal and the narrow band test signal.

In describing more fully this disclosure, we make reference to the following disclosure and definitions. Generally, in a distributed antenna system (DAS), wireless signals are transmitted by several antenna elements. The several antenna elements are separated in space so as to provide coverage over the same physical area as a single antenna but with reduced total power and improved reliability.

In the exemplary embodiments described herein, the distributed antenna system (DAS) includes a central base station and a plurality of remote units (RU). The base station as well as the remote units (RU) may make use of electrical and/or optical technologies that are interface with wireless systems (as well as wired systems upstream of the distributed antenna system (DAS)).

In embodiments discussed herein, the distributed antenna system (DAS) is implemented to provide communications services. For example, the distributed antenna system (DAS) may be implemented to provide voice and/or data communications services. The distributed antenna system (DAS) may be used to communicate any content that may be reduced to an electromagnetic form.

Some introductory and non-limiting aspects of terminology used in this disclosure are now provided. The term "communication service" generally refers to digital data services including but not limited to Ethernet, WLAN, Worldwide Interoperability for Microwave Access (Wi- Max), Radio over Fiber (RoF), Wireless Fidelity (WiFi), PCS band, 2G, 3G, 4G, GSM, Digital Subscriber Line (DSL), and Long Term Evolution (LTE), etc.

The term "distributed antenna system" (or "DAS") generally refers to an antenna system including a plurality of spatially separated antennas. The distributed antenna system (DAS) may communicate with a variety of commercial communications systems to distribute services to clients within range of the distributed antenna system (DAS). The distributed antenna system (DAS) may make use of optical fiber, wired communications cables and any other type of conduit or link deemed appropriate.

The term "narrowband communication signals" generally refers to a specific band of frequencies of operation of a communication service that a provider is permitted to transmit under communication guidelines and permissions.

The term "broadband communication signals" generally refers to a band of communication signals that is made up of two or more narrow bands of communication signals.

The terminology "equalize," "equalization," and other similar terms generally referred to adjusting signal strength to a desired level. Other similar terminology may include "calibrate," "adjust" and the like. Generally, and by way of more specific examples, "equalization" refers to adjustment of frequency response of the DAS channel or path of signals, while terms such as "calibration" referred to equalizing a signal to a standard for a desired parameter.

Generally, each narrow band of frequencies used for communication may be adequately distinguished from another provide for effective communication. However, it is possible that at least some overlapping frequencies may exist. It is not required that each narrow band of frequencies have the same number or a similar number of frequencies within each band.

The term "clients or recipients of these services" generally refers to devices such as cellular phones, smart phones, wireless computers, wireless lap-top computers, mobile devices such as tablet computers, pad computers, personal digital assistant, and wireless sensors or networks of sensors, such as mesh network sensors. These examples are not intended to be limiting, and the present disclosure is not limited to these examples of client devices.

This disclosure is generally drawn, among other things, to methods, apparatus, systems, devices, and computer program products related to insuring the reliability of communications systems. In particular, the disclosure concerns the setup and operation of a wide variety of radio-frequency and digital communications for a communications area, such as within a building. The area may be sufficiently large to require sub-division into a plurality of sectors, such as floors of the building, or other suitable subdivision.

Turning now to the drawings, FIG. 1 depicts an example of a prior art distributed antenna system (DAS) 100. The prior art distributed antenna system (DAS) 100 is implemented on a first floor 101, a second floor 102 and a third floor 103, respectively, of a building 105. In this example a plurality of communications services 110 are provided, such communications services coming from first, second and third base stations 112a, 112b 112c over cables 113a, 113b, 113c respectively. The services are input to a head end unit (HEU) 120 for routing through distributed antenna system 100. The prior art distributed antenna system (DAS) 100 is controlled by a computer 160 with operator input device 162. The computer 160 may include local memory and may have access to remote memory, as well as computer programs stored on at least one non-transitory medium, either locally or remotely. The computer 160 may be connected directly to the head end unit (HEU) 120 and may be in control of other elements of the prior art distributed antenna system (PDAS) 100 via wired connections or remotely, as shown. The computer 160 may also control an optical interface unit (OIU) 125, which may in turn be coupled to optical fiber 122, 124 and 126.

Some additional definitions are provided for the prior art distributed antenna system (PDAS) 100 shown in FIG. 1.

With regard to FIG. 1, the term "head end unit (HEU)" generally refers to a switching matrix for combining a plurality of communications signals into a broad band signal for further transmission, such as to an optical input unit, and for splitting a broadband signal from an optical input unit into individual communication signals, thus allowing two-way communications.

The term "Optical Interface Unit (OIU)" generally refers to a chassis that includes OIMs. The OIMs convert electrical signals to optical signals in a down-link (DL) direction and optical signals into electrical signals in an up-link (UL) direction. The OIMs also include part of a switching matrix for routing signals to and from remote units.

The term "radio distribution/combiner (RDC) generally refers to a device that combines signals into a combined broadband signal and splits a combined broadband signals into separate signals.

The term "remote antenna unit (RU)" generally refers to a device connected to an optical input module that converts and filters a broadband optical signal into a narrow electrical signal and vice versa.

The communication services may be routed through an exemplary distributed antenna system (DAS) 100 as shown in FIG. 1. Cable or hard wire outputs 118 from the head end unit (HEU) 120 may connect to the optical input unit (OIU) 125 and then to interconnect units 130, 140, 150 through the respective optical fiber 122, 124 and 126 for serving the first floor 101, second floor 102, and third floor 103 of building 105. Interconnect units 130, 140, 150 provide mechanical interfaces and power to the cable outputs from the interconnect units.

The computer 160 may be used to control the head end unit (HEU) 120, the optical input unit (OIU) 125 and the interconnect units 130, 140, 150 of the prior art distributed antenna system (DAS) 100. The computer 160 may also control or monitor switches and switch matrices of the head end unit (HEU) 120 and optical input unit (OIU) 125 useful in operation of prior art distributed antenna system (DAS) 100. The computer 160 may be supplied with a non-transitory memory that includes machine executable instructions stored thereon, such as a computer program useful for routing the signals through the system 100.

Within each of first floor 101, second floor 102, and third floor 103, services are provided separately, as shown. Thus, the first floor 101 may be provided, through interconnect unit 130, with an Ethernet wire distribution 132, a Wi-Fi hot spot 134, and a remote unit (RU) 136. In this example, similar services may be provided to the second floor 102 and third floor 103, through respective interconnect units 140, 150 with Ethernet lines 142, 152, Wi-Fi hot spots 144, 154 and remote unit (RU) 146, 156.

As previously described, the communication services may be narrow band electrical signals provided by service providers over different bands of frequencies such as 400 MHz to 2700 MHz frequency range, such as 700 MHz, 850 MHz-, 1900 MHz, and 2300 MHz, as examples. Radio input modules (RIM) may be used as part of the service input. The number of communication services, the number of OIMs, and the number RAUs are a matter of the deployment design.

Having thus provided an overview of a prior art distributed antenna system (DAS) 100, we now turn to features that are provided by this disclosure.

Figure 2A:
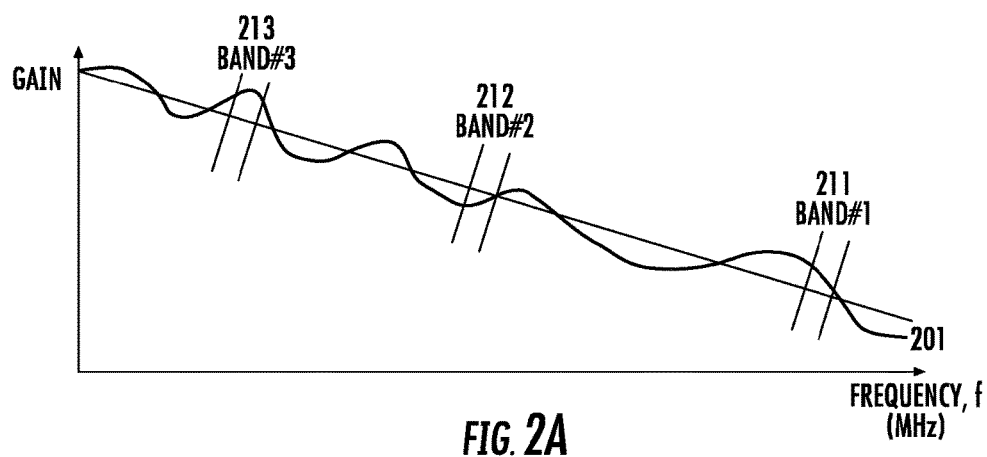
FIGS. 2A, 2B and 2C, collectively referred to herein as FIG. 2, are response curves depicting a frequency response that is uncorrected (FIG. 2A), a frequency response that is adjusted for broadband response (FIG. 2B), and a frequency response that is further adjusted for narrowband response (FIG. 2C)
Figure 2B:
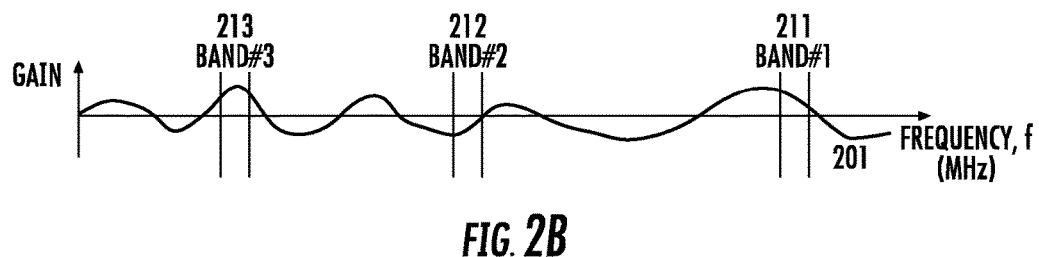
Figure 2C:
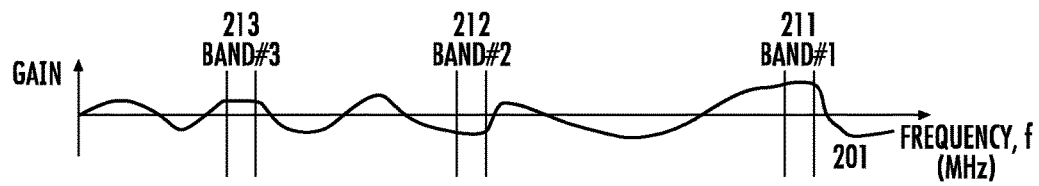

FIGS. 2A, 2B and 2C, collectively referred to herein as FIG. 2, depict a range of operational frequencies for use in a distributed antenna system (DAS). As discussed herein, the range of operational frequencies is simply referred by terms such as "operating frequencies," "operating band," "system frequencies," "range of frequencies," and by other similar terms. In FIG. 2, the range of operational frequencies is depicted as operating range 201.

As may be seen in FIG. 2A, operating range 201 may span a substantial number of frequencies. As discussed above, in an exemplary embodiment, this range may extend from about 400 MHz to about 2700 MHz. In the exemplary embodiment, and within this extended operating range 201, a plurality of narrow bands of signal frequencies, are used for communications. In this example, the plurality of narrow bands of signal frequencies includes a first band 211, a second band 212, and a third band 213. Each one of the first band 211, the second band 212 and the third band 213 are generally substantially separate from each other such that discrimination of signals is possible.

As discussed herein, each narrowband of signal frequencies may be referred by terms such as" a "band," a "narrowband," and by other similar terms.

Also as may be seen in FIG. 2A, the graph of system gain as a function of frequency for the operating range 201 shows a substantially sloped gain function. Given a variety of factors, some of which are described above, the curve depicting the system gain is not straight. That is, it may be considered that the curve depicting the system gain includes a high degree of "ripple," or variation. This variation consists of two elements: a. the slope shown on FIG. 2A, which shows the variation between the lower frequencies and the higher frequencies (the trend-line or slope); and b. the variation over the slope that impacts the gain variation within each of the bands (213, 212, 211). Problematically, the higher the degree of variation or ripple, the lower is the accuracy of gain setting and power monitoring. Smoothing frequency response for the entire operating range 201 decreases system ripple, and therefore increases accuracy of gain setting and of power monitoring.

FIG. 2B depicts the results of a first step of the process described herein. That is, by applying broadband equalization, the system gain may be substantially normalized over the operating range 201. However, broadband equalization may not adequately address the in-band ripple of the specific operating bands (211, 212, 213), and therefore narrowband equalization may be undertaken.

FIG. 2C depicts the results of a second step of the process described herein. That is, by applying narrowband equalization, the system gain may be substantially normalized within each narrowband of frequencies used for communications. In this example, the system gain over each of the first band 211, the second band 212 and the third band 213 is substantially normalized to produce a curve with little to no ripple (that is, the curve is substantially "flattened").

FIG. 3 depicts aspects of further considerations for broadband and narrowband equalization. Before describing aspects of FIG. 3 in detail, consider that each narrowband of frequencies generally includes a plurality of individual frequencies, or sub-groupings of frequencies, and that each narrowband of frequencies may be centered thereabout.

Figure 3A:
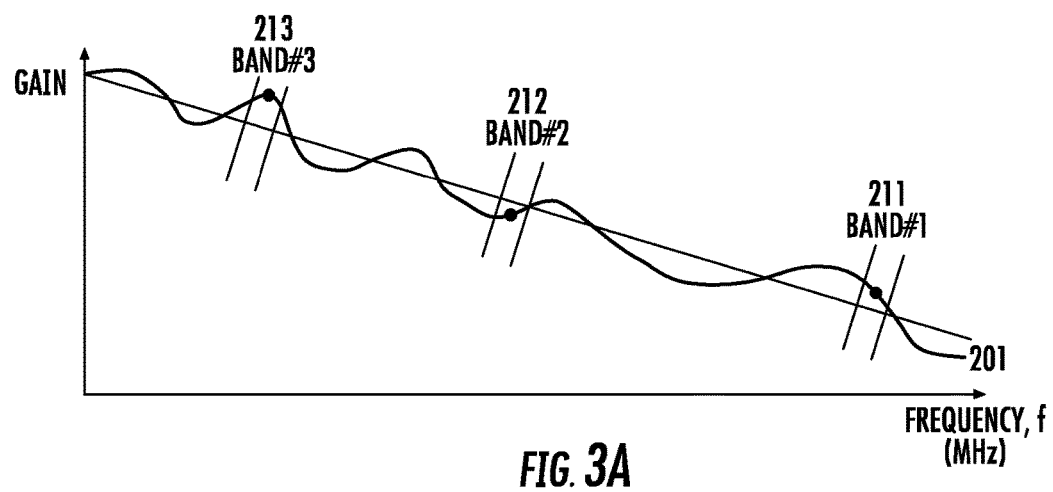
FIGS. 3A and 3B, collectively referred to herein as FIG. 3, are response curves depicting a frequency response that is uncorrected (FIG. 3A), and a frequency response that is adjusted for broadband response (FIG. 3B), further with exploded views depicting gain variations within narrow bands of frequencies.
Figure 3B:
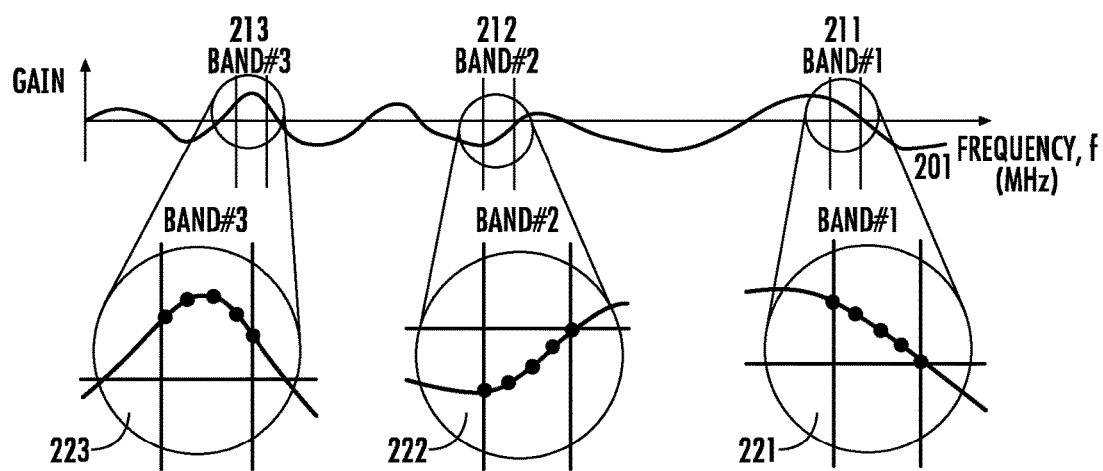

As depicted in FIG. 3A, it may be seen that the gain associated with a center point of each one of the first band 211, the second band 212 and the third band 213 may deviate some distance from a gain value that which would be predicted by a standard line function. Referring to FIG. 3B, the effect of system ripple is shown in greater detail. Specifically, an exploded view 221 is shown for the first band 211. In the exploded view 221, a plurality of data points are shown. A line drawn through the data points shows the gain substantially decreases as a function of frequency over the first band 211. Exploded view 222 is shown for the second band 212. In exploded view 222, a plurality of data points are shown. A line drawn through the data points shows the gain substantially increases as a function of frequency over the second band 212. Exploded view 223 is shown for the third band 213. In exploded view 223, a plurality of data points are shown. A line drawn through the data points shows the gain substantially varies as a function of frequency over the third band 213. Among other things, narrow band equalization provides for substantially smoothing out or flattening the data points across the narrow bands, regardless of whether or not the gain is increasing, decreasing or varying over the respective channel.

Figure 4:
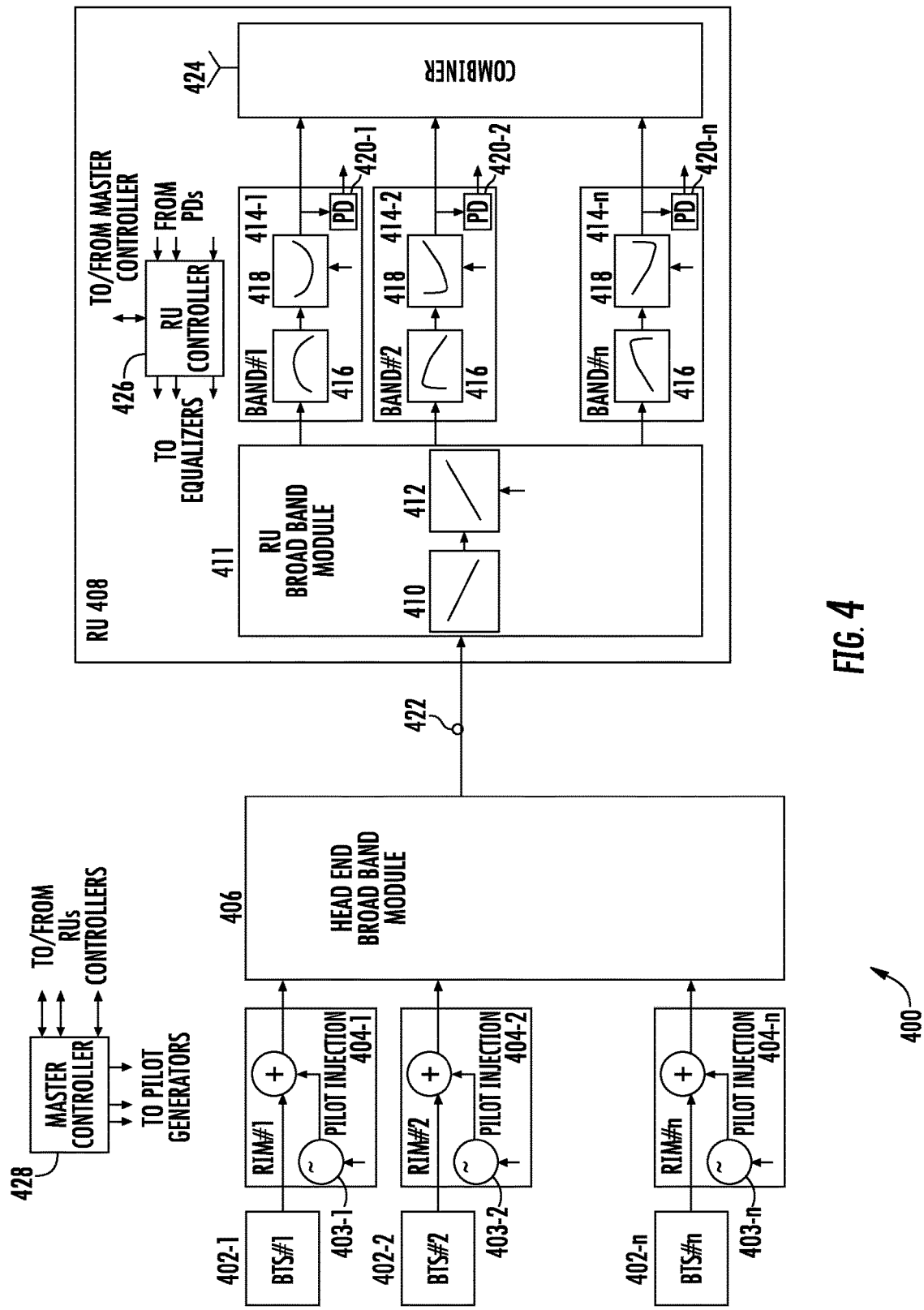
FIG. 4 is a block diagram depicting an architecture for a distributed antenna system (DAS) according to the teachings herein.

Referring now to FIG. 4, an exemplary distributed antenna system (DAS) 400 that is configured for broadband and narrowband equalization depicted. Generally, the distributed antenna system (DAS) 400 includes or may include many of the features of the prior art distributed antenna system (DAS) 100. As one example, the exemplary distributed antenna system (DAS) 400 may include a computer (not shown) similar to computer 160. The computer included in the distributed antenna system (DAS) 400 may likewise include machine executable instructions stored on non-transitory media, the instructions for performing an assigned function. As a matter of convention herein, the instructions may also be referred to as "software." Additional aspects of the distributed antenna system (DAS) 400 according to the teachings herein are depicted in the exemplary and non-limiting embodiment shown in FIG. 4.

In FIG. 4, the distributed antenna system (DAS) 400 includes a plurality of base stations 402 (or "BTS" denoted as 402-1, 402-2, 402-n). Each of the base stations 402 are interfaced to the distributed antenna system (DAS) 400 by a respective radio interface module 404 (or "RIM" denoted as 404-1, 404-2, 404-n). Each of the radio interface modules (RIM) 404 are coupled to a head end unit (or "HEU") 406. In the head end unit (HEU) 406, signals from each of the radio interface modules (RIM) 404 are combined to one or more signal groups (referred to as "layers") and then routed to one or more remote units (or "RU") 408.

Generally, each remote unit (RU) 408 is coupled to the head end unit (HEU) 406 via a network connection 422 such as an optical fiber. Other types of network connections 422 may be used. For example, wired, hybrid and other types of connections may be employed.

Generally, each of the radio interface modules (RIM) 404 includes (among other circuits, a test signal generator 403 (denoted as 403-1, 403-2, 403-n) which can be tuned to generate a test signal in multiple frequencies of the band for which the respective radio interface modules (RIM) 404 operates. Master controller 428 controls the operation of the test signal generator 403 within each of the radio interface modules (RIM) 404. Master controller 428 also communicates with an internal controller 426 (also referred to herein as equalizer controller) for each of the remote units (RU) 408. For up-link (UL) path equalization, the signal generator may be contained in the remote unit (RU) 408, with one generator for each band (not shown in FIG. 4).

Each remote unit (RU) 408 includes a broadband module 411. A respective frequency response and a broadband equalizer 412 are included within each broadband module 411. The broadband module 411 has a particular frequency response. The overall broadband frequency response of the distributed antenna system (DAS) 400, is the accumulation of all the DAS elements. The response shown as 410 is the representation of this overall frequency response that exhibits high gain for low frequencies and low gain at high frequencies. In order to compensate for this frequency response, equalizer 412 is provided to equalize the broadband signal.

Each of the remote units (RU) 408 includes at least one narrowband module 414 (denoted as 414-1, 414-2, 414-n). Each narrowband module 414 provides for processing and equalization of the signal that is provided over each narrowband of frequencies (for example, over the first band 211, the second band 212, or the third band 213 shown in FIG. 3).

Generally include within each narrowband module 414 is a band circuit 416 that provides a response, accumulated with the frequency response of other elements of the distributed antenna system (DAS) 400 and usually provides a narrow band frequency response that will exhibit any one of a limited number of different variation shapes (for example, four or five different shapes). See, for example, the shapes provided in FIG. 3B.

The narrowband frequency response of the signal is equalized by each of a respective narrowband equalizers 418. Included in each narrowband module 414 is a power detector (PD) 420 (denoted as 420-1, 420-2, 420-n). Generally, each power detector (PD) 420 is used to measure the power of a test signal that is generated at a related one of the radio interface modules (RIM) 404. Generally, each of the power detectors (PD) 420 is configured to detect the test signal for a particular narrowband of frequencies. For up-link (UL) path equalization, the power detector (PD) 420 is contained in the radio interface modules (RIM) 404.

The power detectors (PD) 420 provide data on the signal strength for the respective test signal to internal controller 426. Using the signal strength, the internal controller 426 calculates the required equalization to be applied by the narrowband equalizers 418 and then adjusts each of the narrowband equalizers 418 accordingly by applying one of the pre-determined equalization shapes.

Figure 5:
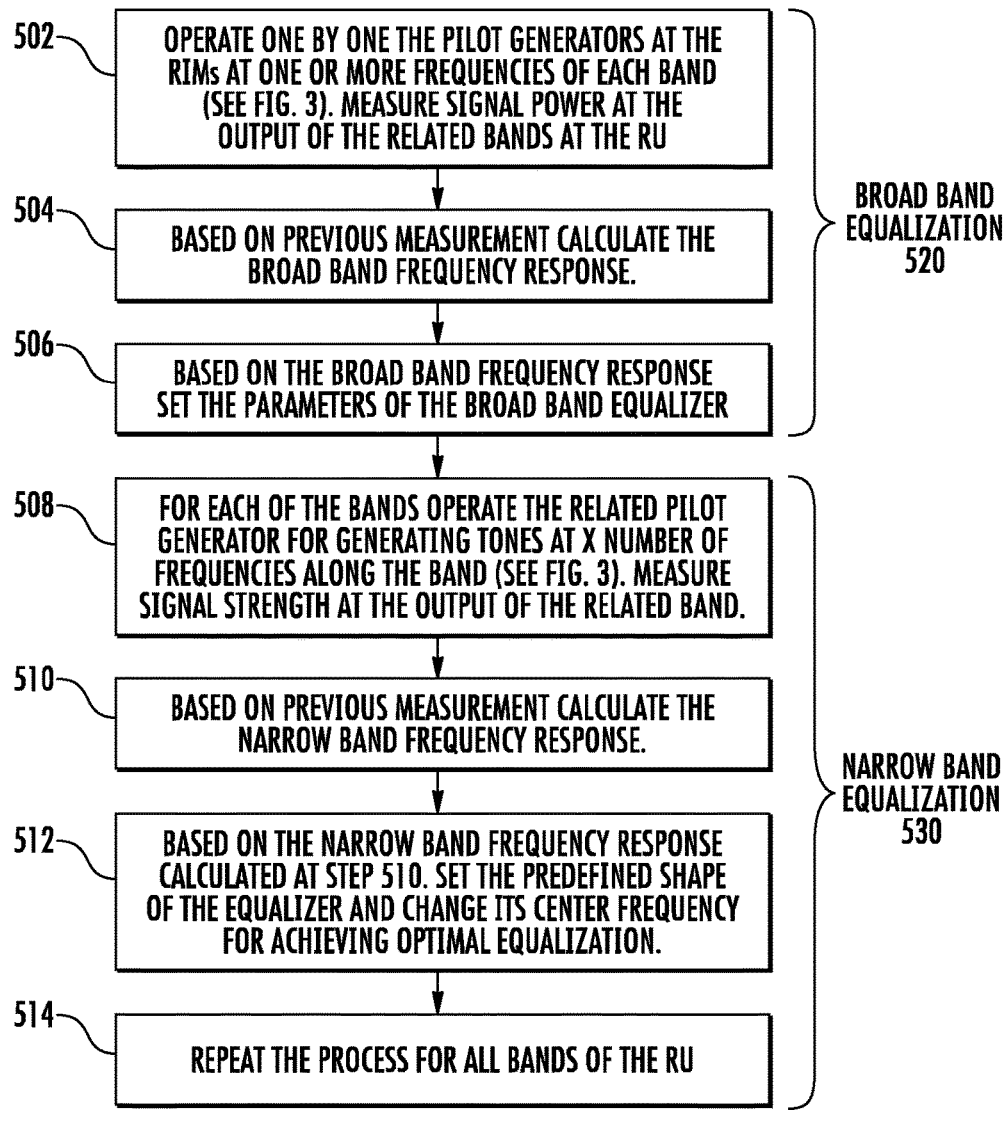
FIG. 5 is a flow chart depicting an exemplary method for calibration of a down link (DL) path for distributed antenna system as shown in FIG. 4.

FIG. 5 provides a flow chart depicting an exemplary non-limiting method for equalization 500. Generally, a method for equalization 500 is a two-step process. In a first phase, broadband equalization 520 completed. In a second phase, narrowband equalization 530 completed. Each of the broadband equalization 520 and narrowband equalization 530 involve various tasks as further set forth in FIG. 5 and described elsewhere here. Generally, the method for equalization 500 is performed for each remote unit (RU) 408 that exists within the distributed antenna system (DAS) 400 and for each narrow band and makes use of the various components set forth in FIG. 4.

While the method for equalization 500 depicted in FIG. 5 is particular for a single remote unit (RU) 408, it should be noted that other remote units (RU) 408 within the distributed antenna system (DAS) 400 may also affect the signals for any given remote unit (RU) 408. Accordingly, the method provided may be performed at least in part in conjunction with other remote units (RU) 408, such that the effect of signals transmitted from the other remote units (RU) 408 may be factored into the method for equalization 500. Accordingly, the method for equalization 500 depicted in FIG. 5 should be considered as merely illustrative and introductory for techniques for operation of the distributed antenna system (DAS) 400 and not limiting thereof.

For example, it should be recognized that the method for equalization 500 may further include statistical weighting of signal strength according to the number and strength of signals produced by other remote units (RU) 408. As techniques for statistical weighting are generally known, these are not discussed in greater detail here in.

In a first step 502, each one of the test signal generators 403 (403-1, 403-2, 403-n, and so on) is commanded to provide test signals. The test signals generated are provided at one or more frequencies of each narrowband. For example, the test signals may be a sweep of test signals starting at one frequency and ending at another frequency in the band. Each of the power detectors (PD) 420 (420-1, 420-2, 420-n, and so on) is used to detect the test signals and measure the power of the test signals at the location of the remote unit (RU) 408.

In a second step 504, the internal controller 326 uses the measurements of the power detectors (PD) 420 as an input and calculates a broadband frequency response for each signal route (that is, from each test signal generator 403 to the remote unit (RU) 408).

In a third step 506, the internal controller 326 sets the parameters of the broadband equalizer 412 (as discussed in greater detail further herein).

In a fourth step 508, the internal controller 426 submits a request to master controller 428. In turn, master controller 428 commands the each of the test signal generators 403 to generate a plurality of test signals at the desired number of narrow bands of frequencies. For example, the plurality of test signals may be a sweep of test signals starting at one frequency and ending at another frequency in the desired number of narrow bands. As with the broadband signal, the power detectors (PD) 420 are used to measure the signal strength of each of the narrowband test signals.

In a fifth step 510, the internal controller 426 uses the measurements of the power detectors (PD) 420 as an input and calculates a narrowband frequency response for each signal route.

In some embodiments, the plurality of test signals includes sub-groupings of frequencies within each narrowband of frequencies (or channel). Accordingly, the internal controller 426 may determine a response curve within each narrowband of frequencies. Refer to the exploded views 221, 222, and 223 provided in FIG. 3B.

In a sixth step 512, the internal controller 426 selects settings for the narrowband equalizer 418 for each narrowband of frequencies. Selection may be according to the shape of the response curve determined in the fifth step 510. The settings for the narrowband equalizer 418 may be predetermined and stored in a lookup table. For example, it may be considered that there are generally four to five shapes for response curves, and therefore four to five complementary equalizer settings for the narrowband equalizer 418. As such, the internal controller 426 may merely be required to ascertain a shape for the response curve, and then to look up and apply the predetermined equalizer settings to the narrowband equalizer 418. As previously disclosed, the applied equalizer settings would illustratively smooth out or flatten the data points across the narrow bands, regardless of whether or not the gain is increasing, decreasing or varying over the respective band.

In a seventh step 514, the fourth step 508, the fifth step 510, and the sixth step 512 are repeated until all narrowband frequencies used by the respective remote unit (RU) 408 have been evaluated.

When the equalization process is completed, a further gain adjustment can be made for each band at each of the remote units (RU) 408. For example, further gain adjustment may be accomplished using digitally controlled attenuators (DCA) located, for example, at the signal path.

Figure 6:
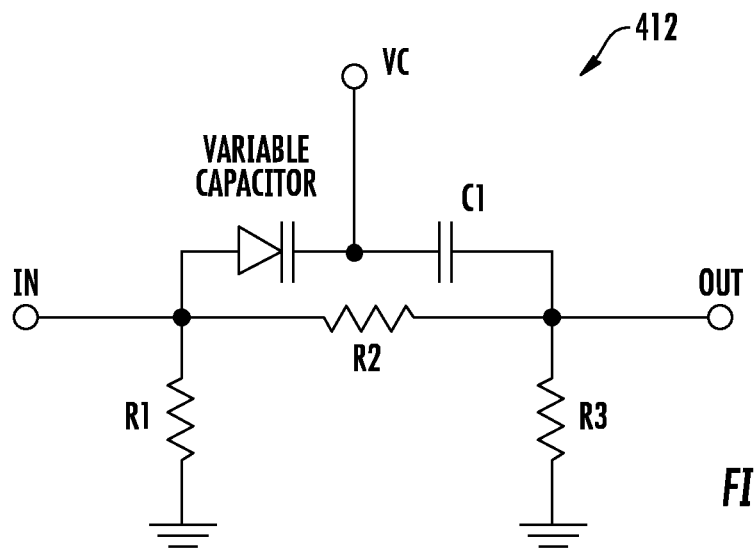
FIG. 6 is a schematic depicting aspects of an exemplary embodiment of a broadband equalizer.

FIG. 6 is a simplified electrical schematic diagram depicting an embodiment of the broadband equalizer 412. This embodiment of the broadband equalizer 412 is based on a PI attenuator. In some embodiments, a T attenuator may be used. In order to get a slope of the attenuation level over the broadband frequency range, a high-pass filter response was added by including a capacitor on top of the series resistor. Additionally, controlling the capacitance in order to get a controllable slope is achieved by use of variable capacitor diode (a "Varicap"), which is controlled by a digital to analog converter (DAC) or digital potentiometer. Use of the digital to analog converter (DAC) or digital potentiometer results in a digitally controlled capacitor and digitally controlled high-pass filter. Collectively, this results in a digitally controlled embodiment of the broadband equalizer 412. In some embodiments, a digitally controlled capacitor component is used.

Figure 7:
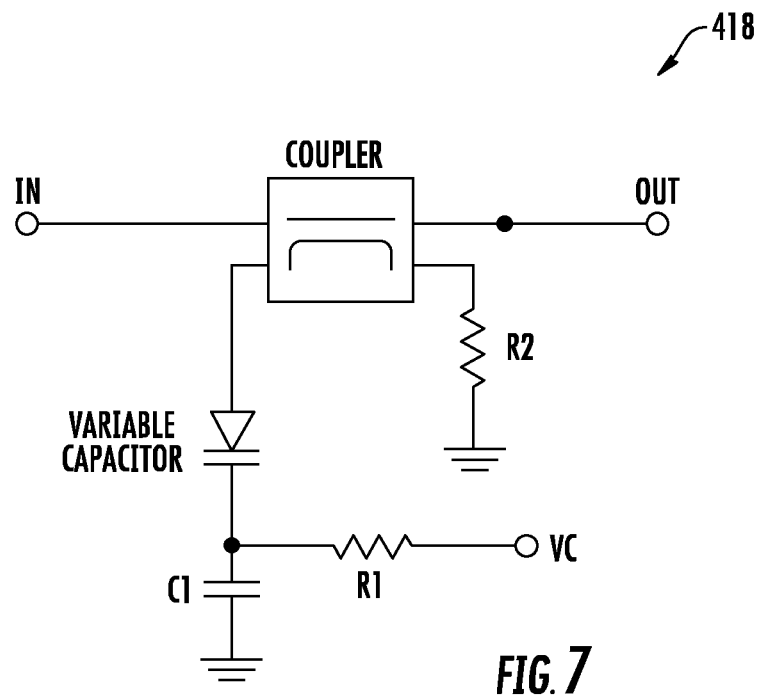
FIG. 7 is a schematic depicting aspects of an exemplary embodiment of one stage of the narrow band equalizer. The narrow band equalizer may include one or more consecutive equalizer stages of the type shown.
Figure 8A:
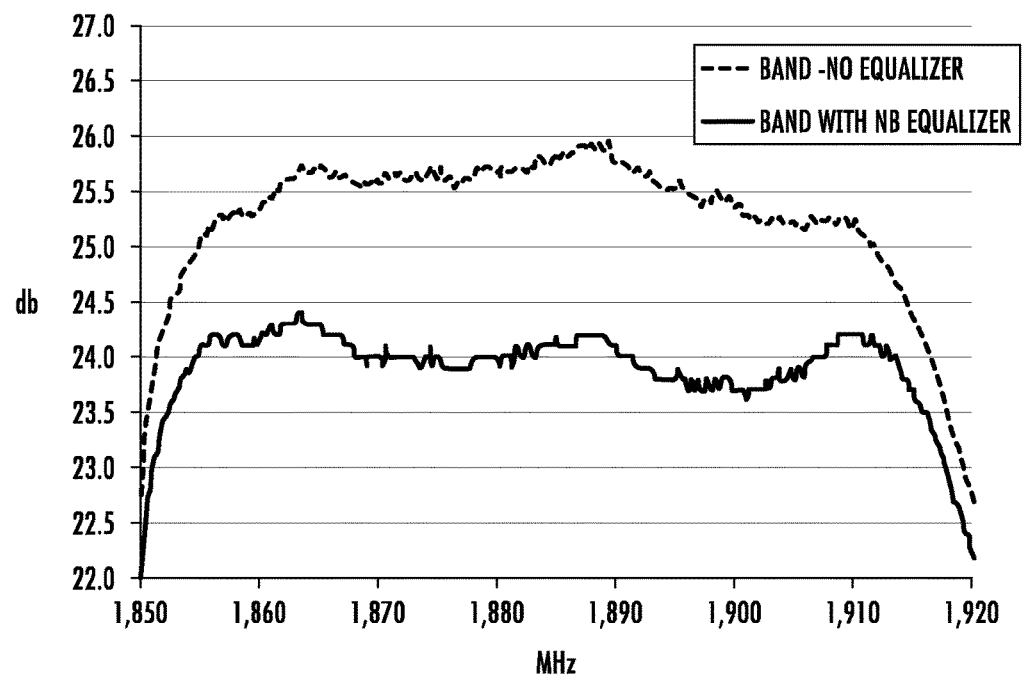
FIGS. 8A and 8B, collectively referred to herein as FIG. 8, are response curves depicting uncorrected and corrected frequency response for a narrowband signal (FIG. 8A), and the frequency response of the narrow band equalizer for correcting the frequency response shown (FIG. 8B)
Figure 8B:
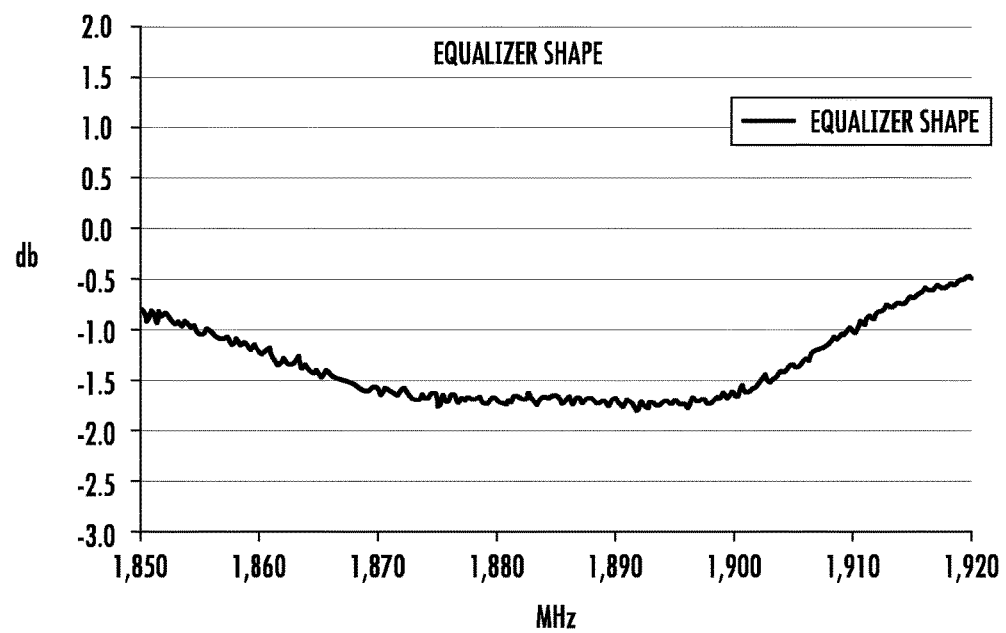

FIG. 7 is a simplified electrical schematic diagram depicting an embodiment of the narrowband equalizer 418. Processing of the narrowband of frequencies with the narrowband equalizer 418 results in a "U" shaped frequency response curve while the minimum point location in the frequency domain is controllable. Reference may be had to FIG. 8B, which depicts the shape of an exemplary response curve from the broadband equalizer 412 over a narrowband of frequencies, and FIG. 8A which depicts a narrowband signal before and after the narrowband equalization was applied.

Referring to FIG. 9, frequency response for a single stage (section) of a narrow band equalizer is shown. By adjusting the equalizer stage, the whole shape moves in the frequency domain (shape of the curve remains substantially similar, but location of the center frequency, $f_c$, is moved along the frequency domain). The regions denoted as "A," "B," and "C" define approximately sub-groupings for location of the narrowband equalizer shape.

Figure 9A:
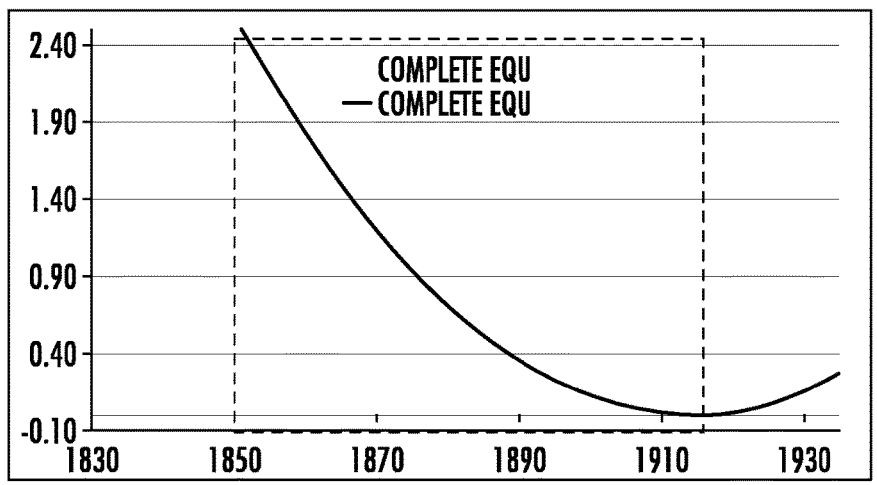
Figure 9B:
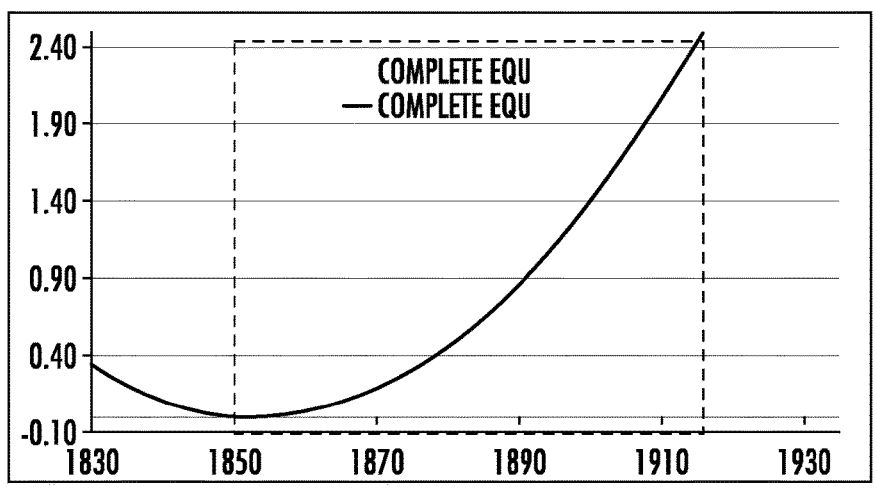
Figure 9C:
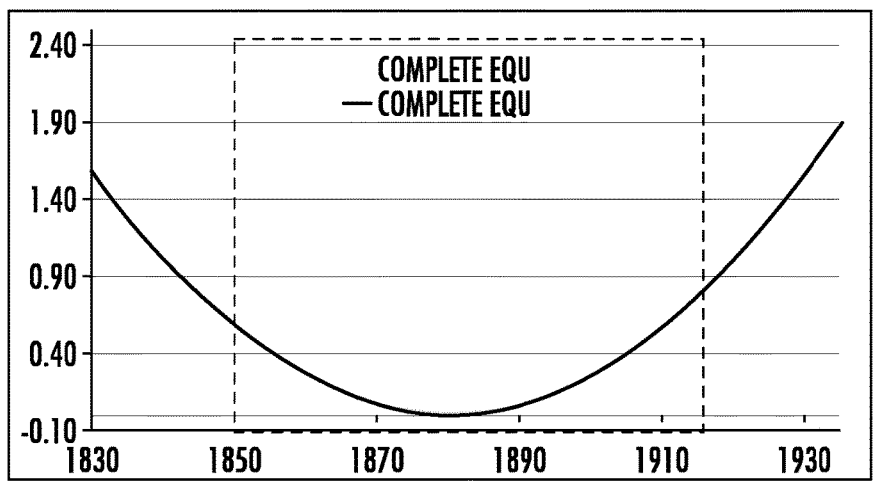

In FIG. 9A, one section of an equalizing shape is located on the right edge of the band. Others are equalizing shapes are disabled. In FIG. 9B, one section of an equalizing shape is located on the left edge of the band. Other equalizing shapes are disabled. In FIG. 9C, one section of an equalizing shape is located on the center of the band. Other shapes are disabled. In FIG. 9D, one section of an equalizing shape Eq Seg 1 and another section of an equalizing shape Eq Seg 3 are turned ON with another section of an equalizing shape Eq Seg 2 disabled. In FIG. 9E, one section of an equalizing shape Eq Seg 1 and another section of an equalizing shape 3 are turned ON with another section of an equalizing shape Eq Seg 2 disabled. Finally, FIG. 9F depicts all sections of an equalizing shape Eq Seg 1, 2, and 3 turned ON with no equalizing shape Eq Seg disabled.

Figure 10:
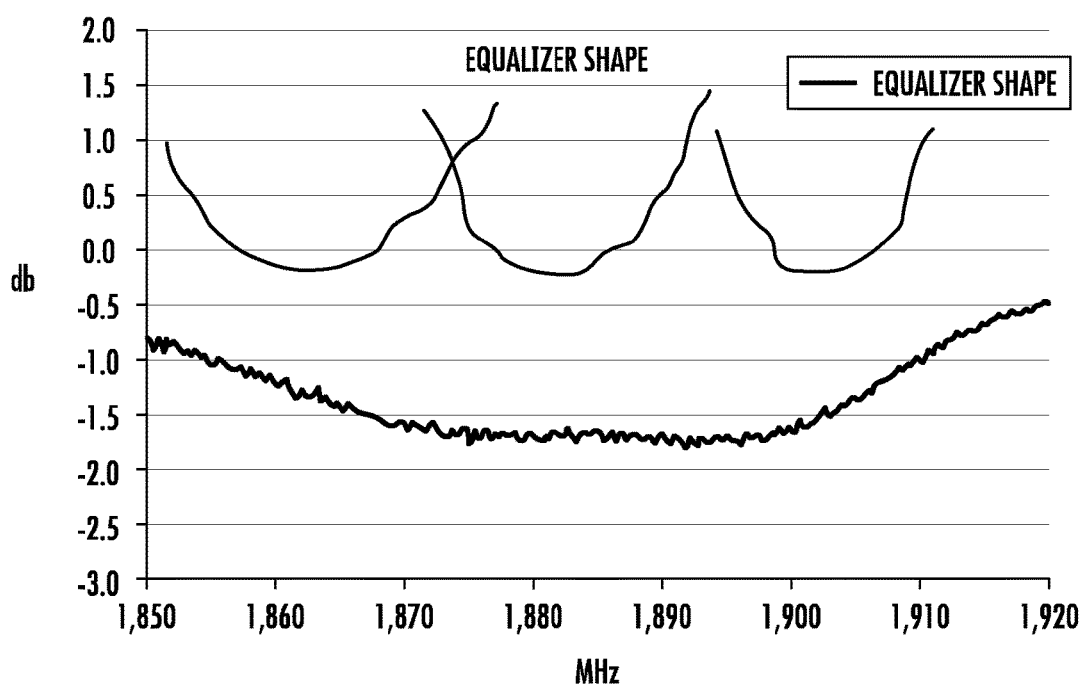
FIG. 10 is a graph providing frequency response of a single stage of a narrow band equalizer and also shows partial contribution of each of the equalizer stages. The superposition of the contribution of all equalizer stages creates the frequency response of the narrow band equalizer.

By adjusting where the center frequency, $f_c$, of the minimum is applied, the narrowband equalization may be controlled. FIG. 10 provides an exemplary response curve for a broadband equalization with exemplary data, along with three regions for narrowband equalization.

FIG. 10 also shows partial contribution of each of the equalizer stages. The superposition of the contribution of all equalizer stages creates the frequency response of the complete narrow band equalizer.

In the exemplary embodiment, each band of the narrowband of frequencies may make use of one to three equalizers.

Refer also to FIG. 11, where exemplary narrowband equalization data is provided.

In FIG. 11, four separate narrow bands of frequencies are provided. These include PCS (1850-1915 MHz), PCS (1930-1995 MHz), CELL (824-849 MHz) and CELL (869-894 MHz). However, these bands are merely exemplary. Bands chosen may lie anywhere within the frequencies of 700 to 2700 MHz and/or beyond. Three narrowband equalizers are used for equalizing the PCS signals, while two narrowband equalizers are used for the CELL signals. In each instance, the center frequency for the respective region is increased by means of control voltage increase, (however this can be done digitally as well). By adjusting the applied voltage in each region, narrowband equalization may be controlled such that the slope of the curve over the narrowband of frequencies is controlled. Note that in this illustrative example, the applied voltage is applied to the narrowband equalization circuit discussed with reference to FIG. 6.

Having thus introduced the distributed antenna system (DAS) 100, some further aspects and embodiments are provided.

It should be noted that the two step equalization process (broadband and narrow band) can be done for both the down-link (DL) paths and for up-link (UL) paths. The foregoing description focuses on equalization of the down-link (DL) path. Equalization for the up-link (UL) path is very similar. In some embodiments for equalization of the up-link (UL) path, the test signal generator is located at the remote unit (RU) and power detection is done at the radio interface modules (RIM). The equalizers may reside either at the radio interface module (RIM) or at the remote unit (RU).

In one embodiment, a distributed antenna system (DAS) is provided. The distributed antenna system (DAS) includes at least one radio interface module (RIM) associated with a remote unit (RU), the radio interface module (RIM) and the remote unit (RU) configured for transmitting and receiving at least one narrow band of frequencies within a broad band channel over a signal path; a signal generator associated with a signal path between the radio interface module (RIM) and the remote unit (RU), the signal generator configured for generating a test signal; a master controller configured to generate the test signal; and, an equalizer for adjusting a gain setting for the signal path according to the at least one narrow band of frequencies.

The radio interface module (RIM) may include the signal generator, and may further include a head end unit (HEU), the head end unit (HEU) being coupled to the radio interface module (RIM) for transmission and reception of the broad band channel as well as the at least one narrow band of frequencies to and from the remote unit (RU); wherein the coupling may include a coupling selected from the group of couplings of an optical coupling, a wired coupling, and a hybrid optical and wired coupling.

The remote unit (RU) may include a remote unit controller (RU Controller) for controlling the equalizer, and the remote unit (RU) may include a power detector (PD) configured to monitor power of at least one of the test signal and the narrow band of frequencies, and providing a corresponding power level to the remote unit controller (RU Controller); wherein the remote unit controller (RU Controller) is configured to adjust the equalizer according to power detected for at least one of the test signal and the narrow band of frequencies; and wherein the remote unit controller (RU Controller) is configured to transmit and receive control signals from the master controller.

The equalizer may include a broad band equalizer section and one or more narrow band equalizer sections, and each of the one or more narrow band equalizer sections may include a pre-defined setting for adjusting the frequency response of the at least one narrow band of frequencies, and the broad band equalizer section may include one of a PI attenuator and a T attenuator for equalizing the signal over the broad signal range, and one of the narrow band equalizer sections may be configured to provide a controllable slope, and each of the one or more narrow band equalizer sections may include at least one resonance circuit for equalizing the signal over the at least one channel.

In another embodiment, a method for adjusting a distributed antenna system (DAS) is provided. The method includes broadcasting a test signal over a frequency range using at least one narrow band of frequencies over a signal path; detecting power for the test signal at a remote unit; and, adjusting gain for the broadcasting for the at least one narrow band of frequencies to increase response over the signal path.

The broadcasting may include providing the test signal over a range of 100 MHz to 3500 MHz. Adjusting the gain may be performed prior to broadcasting the test signal for the at least one narrow band of frequencies. Adjusting the gain for each of the at least one narrow band of frequencies may include ascertaining a center-point, fc, of each narrow band of frequencies and applying predefined gain settings for the narrow band of frequencies. Adjusting the gain for each of the at least one narrow band of frequencies may further include evaluating effect on the response over the broad band channel; and, performing the adjusting to result in an optimal match between the system response for the at least one narrow band of frequencies and system response over the broad band channel. The signal path may include one of an up-link (UL) and a down-link (DL).

In yet another embodiment, a computer program product stored on non-transitory machine readable media is provided. The product includes machine executable instructions for adjusting output of a distributed antenna system (DAS), by implementing instructions for: broadcasting a test signal over a frequency range using at least one narrow band of frequencies over a signal path; detecting power for the test signal at a remote unit (RU); and, adjusting gain for the broadcasting for the at least one narrow band of frequencies to increase response for over the signal path.

The product may further include instructions for setting parameters of an equalizer for equalizing signal over at least one of the narrow bands of frequencies; instructions for generating a test signal at a plurality of frequencies within at least one of the narrow bands of frequencies; as well as instructions for measuring power for at least one of the narrow bands of frequencies, and these may further include instructions for performing the adjusting according to the power measured for at least one of the narrow bands of frequencies.

In a further embodiment still, a distributed antenna system (DAS) is provided. The distributed antenna system (DAS) includes a plurality of radio interface modules (RIM), each radio interface module (RIM) configured to transmit and receive at least one narrow band of frequencies over a signal path; a head end unit (HEU) configured for transmitting signals for each of the at least one narrow band of frequencies; a remote unit (RU) configured for receiving and transmitting signals from the head end unit (HEU); the remote unit (RU) including a broad band equalizer module, a plurality of narrow band equalizer modules and an equalizer controller, the equalizer controller configured for determining a gain adjustment to be applied by the broad band equalizer module and the narrow band equalizer modules; and a master controller configured for controlling the radio interface module (RIM) and the equalizer controller.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, or systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

Where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention.

What is claimed is:

1. A distributed antenna system (DAS) comprising:
   at least one radio interface module (RIM) associated with a remote unit (RU), the radio interface module (RIM) and the remote unit (RU) configured for transmitting and receiving at least one narrow band of frequencies within a broad band channel over a signal path;
   a signal generator associated with a signal path between the radio interface module (RIM) and the remote unit (RU), the signal generator configured for generating a test signal;
   a master controller configured to generate the test signal; and
   an equalizer for adjusting a gain setting for the signal path according to the at least one narrow band of frequencies.

2. The distributed antenna system (DAS) of claim 1, wherein the radio interface module (RIM) comprises the signal generator.

3. The distributed antenna system (DAS) of claim 2, further comprising a head end unit (HEU), the head end unit (HEU) being coupled to the radio interface module (RIM) for transmission and reception of the broad band channel as well as the at least one narrow band of frequencies to and from the remote unit (RU).

4. The distributed antenna system (DAS) of claim 3, wherein the coupling comprises a coupling selected from the group consisting of an optical coupling, a wired coupling, and a hybrid optical and wired coupling.

5. The distributed antenna system (DAS) of claim 4, wherein the remote unit (RU) comprises a remote unit controller (RU Controller) for controlling the equalizer.

6. The distributed antenna system (DAS) of claim 5, wherein the remote unit (RU) comprises a power detector (PD) configured to monitor power of at least one of the test signal and the narrow band of frequencies, and providing a corresponding power level to the remote unit controller (RU Controller).

7. The distributed antenna system (DAS) of claim 6, wherein the remote unit controller (RU Controller) is configured to adjust the equalizer according to power detected for at least one of the test signal and the narrow band of frequencies.

8. The distributed antenna system (DAS) of claim 7, wherein the remote unit controller (RU Controller) is configured to transmit and receive control signals from the master controller.

9. The distributed antenna system (DAS) of claim 4, wherein the equalizer comprises a broad band equalizer section and one or more narrow band equalizer sections.

10. The distributed antenna system (DAS) of claim 9, wherein the each of the one or more narrow band equalizer sections comprises a pre-defined setting for adjusting a frequency response of the at least one narrow band of frequencies.

11. The distributed antenna system (DAS) of claim 9, wherein the broad band equalizer section comprises one of a PI attenuator and a T attenuator for equalizing the test signal over a broad signal range.

12. The distributed antenna system (DAS) of claim 9, wherein one of the narrow band equalizer sections is configured to provide a controllable slope.

13. The distributed antenna system (DAS) of claim 9, wherein each of the one or more narrow band equalizer sections comprises at least one resonance circuit for equalizing the test signal.

14. A method for adjusting a distributed antenna system (DAS), the method comprising:
broadcasting a test signal over a frequency range using at least one narrow band of frequencies over a signal path;
detecting power for the test signal at a remote unit; and
adjusting gain for the broadcasting for the at least one narrow band of frequencies to increase response over the signal path, wherein adjusting the gain is performed prior to broadcasting the test signal for the at least one narrow band of frequencies,
wherein adjusting the gain for each of the at least one narrow band of frequencies comprises ascertaining a center-point, $f_c$, of each narrow band of frequencies and applying predefined gain settings for the narrow band of frequencies.

15. The method of claim 14, wherein the broadcasting comprises providing the test signal over a range of 100 MHz to 3500 MHz.

16. The method of claim 14, wherein the signal path comprises one of an up-link (UL) and a down-link (DL).

17. A method for adjusting a distributed antenna system (DAS), the method comprising:
broadcasting a test signal over a frequency range using at least one narrow band of frequencies over a signal path;
detecting power for the test signal at a remote unit; and
adjusting gain for the broadcasting for the at least one narrow band of frequencies to increase response over the signal path, wherein adjusting the gain is performed prior to broadcasting the test signal for the at least one narrow band of frequencies,
wherein adjusting the gain for each of the at least one narrow band of frequencies further comprises:
evaluating effect on the response over a broad band channel; and,
performing the adjusting to result in an optimal match between the system response for the at least one narrow band of frequencies and system response over the broad band channel.

18. A distributed antenna system (DAS) comprising:
a plurality of radio interface modules (RIM), each radio interface module (RIM) configured to transmit and receive at least one narrow band of frequencies over a signal path;
a head end unit (HEU) configured for transmitting signals for each of the at least one narrow band of frequencies;
a remote unit (RU) configured for receiving and transmitting signals from the head end unit (HEU);
the remote unit (RU) comprising a broad band equalizer module, a plurality of narrow band equalizer modules and an equalizer controller, the equalizer controller configured for determining a gain adjustment to be applied by the broad band equalizer module and the narrow band equalizer modules; and
a master controller configured for controlling the radio interface module (RIM) and the equalizer controller.

\* \* \* \* \*